(12) United States Patent
Pilat et al.

(10) Patent No.: US 9,806,214 B2
(45) Date of Patent: Oct. 31, 2017

(54) PHOTOVOLTAIC MODULE WITH IMPROVED MECHANICAL AND ELECTRICAL LINKS

(75) Inventors: Eric Pilat, Brison-saint-innocent (FR); Alexandre Vachez, Barberaz (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 384 days.

(21) Appl. No.: 14/342,435

(22) PCT Filed: Aug. 31, 2012

(86) PCT No.: PCT/EP2012/067037
§ 371 (c)(1),
(2), (4) Date: May 24, 2014

(87) PCT Pub. No.: WO2013/030383
PCT Pub. Date: Mar. 7, 2013

(65) Prior Publication Data
US 2014/0299173 A1  Oct. 9, 2014

(30) Foreign Application Priority Data

Sep. 1, 2011 (FR) ...................................... 11 57735

(51) Int. Cl.
*H01L 31/044* (2014.01)
*H01L 31/05* (2014.01)
(Continued)

(52) U.S. Cl.
CPC ......... *H01L 31/0508* (2013.01); *H01R 13/73* (2013.01); *H02S 40/36* (2014.12)

(58) Field of Classification Search
CPC ....... H01L 31/00–31/078; Y02E 10/50–10/60; H02S 10/00–10/40; H02S 10/50–10/60; H02S 20/00–20/32
(Continued)

(56) References Cited

U.S. PATENT DOCUMENTS 5,417,595 A * 5/1995 Cullen ............... H01R 13/2421
                                                          439/700
7,530,830 B1    5/2009 Lenox
(Continued)

FOREIGN PATENT DOCUMENTS

JP       6-163964 A      6/1994
JP       8-288532       11/1996
(Continued)

OTHER PUBLICATIONS

Notification of the First Office Action from SIPO (State Intellectual Property Office of the People's Republic of China) for corresponding Chinese application 201280050301.4 mailed Nov. 13, 2015. English translation.

(Continued)

*Primary Examiner* — Bach Dinh
(74) *Attorney, Agent, or Firm* — Haug Partners LLP

(57) ABSTRACT

Photovoltaic module device (1) comprising a photovoltaic module (4) and an electrical connection element of a first type (2), characterized in that the connection element of the first type comprises an electrical connector of a first type (24, 25) and a first mechanical link element (23, 26) from the photovoltaic module to the electrical connector of the first type.

11 Claims, 6 Drawing Sheets

(51) Int. Cl.
*H01R 13/73* (2006.01)
*H02S 40/36* (2014.01)

(58) Field of Classification Search
USPC .................................... 136/243–265
See application file for complete search history.

(56) References Cited

U.S. PATENT DOCUMENTS

2005/0279400 A1* 12/2005 Banister ............... H01L 31/052
 136/244
2014/0166082 A1* 6/2014 Langmaid ............. F24J 2/5262
 136/251

FOREIGN PATENT DOCUMENTS

| | | |
|---|---|---|
| JP | 2008-177078 | 7/2008 |
| WO | WO 93/14525 A | 7/1993 |
| WO | WO 2008/076879 A | 6/2008 |
| WO | WO 2009/121062 A | 10/2009 |

OTHER PUBLICATIONS

English Translation of the Office Action issued in corresponding Japanese Application No. 2014-527687 mailed Jul. 5, 2016.
Office Action issued in corresponding Japanese Application No. 2014-527687 dated Jun. 6, 2017 and its English Translation.

* cited by examiner

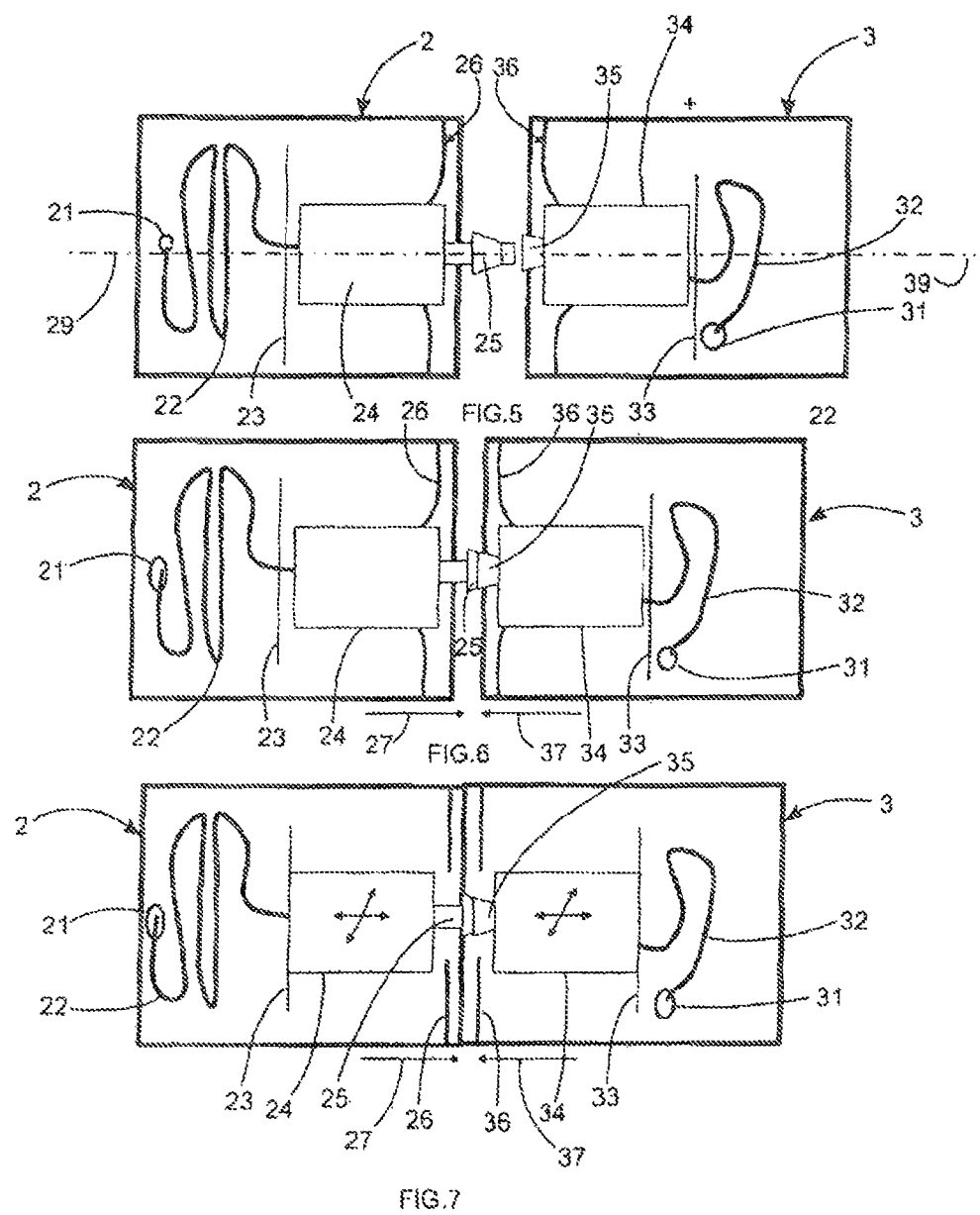

PHOTOVOLTAIC MODULE WITH IMPROVED MECHANICAL AND ELECTRICAL LINKS

This application is a 371 of PCT/EP2012/067037 filed on Aug. 31, 2012, published on Mar. 7, 2013 under publication number WO 2013/030383 A, which claims priority benefits from French Patent Application Number 1157735 filed Sep. 1, 2011, the disclosure of which is incorporated herein by reference.

BACKGROUND

1. Field of the Invention

The present invention relates to a photovoltaic module device. The invention also relates to an assembly of photovoltaic modules.

2. Related Art

A known technique is to implement photovoltaic modules by electrically connecting together several photovoltaic cells. The modules are connected together in series or in parallel by means of cables equipped with standard connectors. Numerous types of standard connectors exist. The connection by cable allows an electrical connection to be established between the modules and, by virtue of its flexibility, allows a good compensation for the defects in alignment and for potential differential expansion phenomena which may be observed in particular on roofing frameworks.

A photovoltaic module device 50 known from the prior art is described hereinafter with reference to FIG. 1. The photovoltaic module device comprises the photovoltaic module 51 itself, a connection housing 52 from which connection cables 53 and 55 come out and at the ends of which connectors 54 and 56 are located.

With such module devices, it is possible to form an assembly 60 shown in FIG. 2 and in which module devices 50 are connected in series in two loops 62 and 61. The module devices are connected together via the connection cables 53 and 55 and via the connectors 54 and 56.

In addition to the cost aspects and difficulty in implementation, the cables represent a significant risk of failure. Indeed, cables are by their nature fragile and it is common to see damaged cables on construction sites. Moreover, the passage of the cables often requires a particular infrastructure of the cable tray type.

BRIEF SUMMARY OF THE INVENTION

The aim of the invention is to provide a photovoltaic module allowing the aforementioned problems to be overcome and improving the photovoltaic modules known from the prior art. In particular, the invention provides a photovoltaic module allowing a quick, easy, reliable and cost-effective installation of an assembly of interconnected modules.

BRIEF DESCRIPTION OF THE DRAWINGS

The appended drawings show, by way of examples, several embodiments of a photovoltaic module according to the invention.

FIGS. 5 to 7 show the steps of an installation method for such an assembly, the modules having a first embodiment of connection elements.

DETAILED DESCRIPTION

Figure 1:
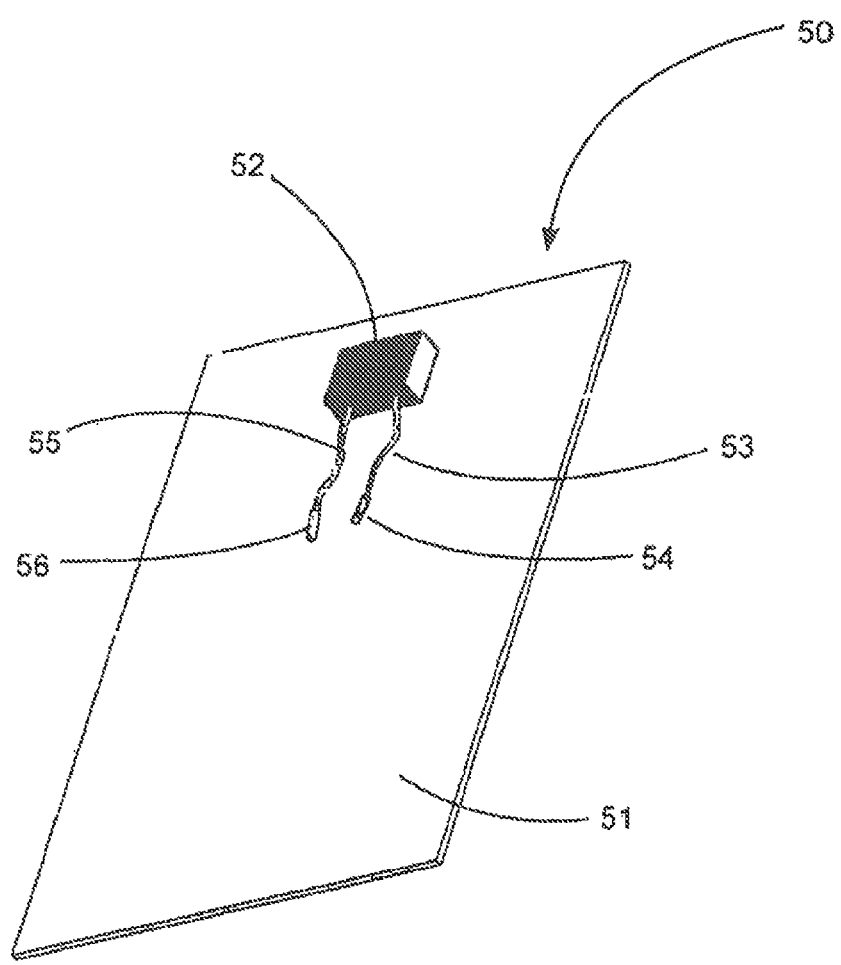
FIG. 1 is a perspective view of a photovoltaic module known from the prior art.
Figure 2:
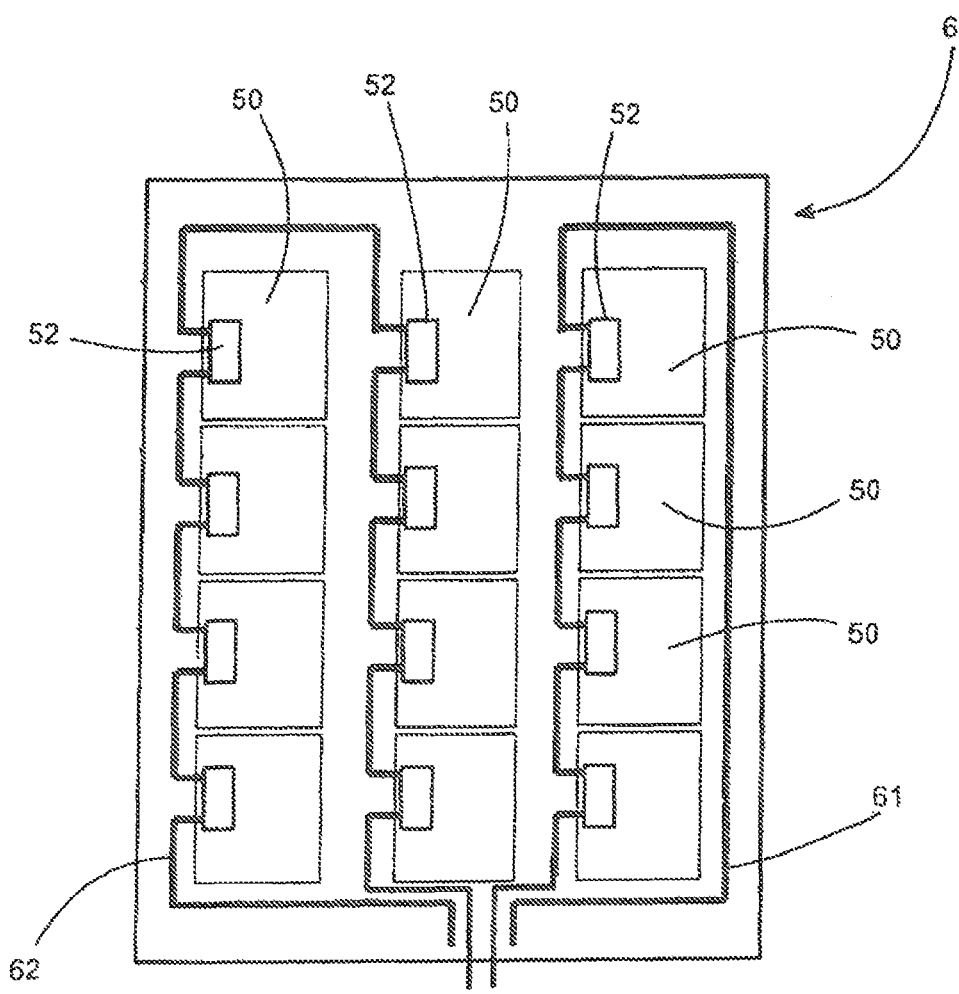
FIG. 2 is a schematic view of an assembly of interconnected photovoltaic modules known from the prior art.
Figure 3:
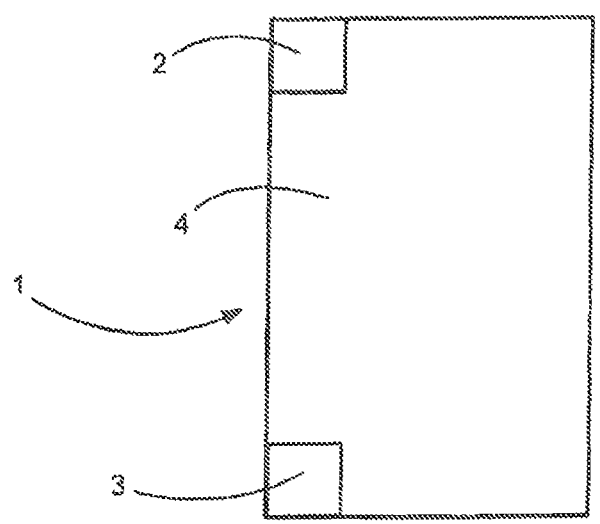
FIG. 3 is a schematic view of one embodiment of a photovoltaic module according to the invention.

A first embodiment of a photovoltaic module device 1 is described hereinafter with reference to FIGS. 3 and 5. It comprises a photovoltaic module 4 and an electrical connection element 2 of a first type. The connection element of the first type comprises an electrical connector 24, 25 of a first type, for example a male connector, and a first mechanical link element 23, 26 from the photovoltaic module to the electrical connector of the first type. "Mechanical link element" is taken to mean any rigid or semi-rigid mechanical link element. The rigidity of this link is sufficient to allow the electrical connector of the first type to be plugged or snapped into a complementary element, such as an electrical connector of a second type, without exerting a mechanical action directly on the electrical connector of the first type, preferably by exerting a mechanical action on the photovoltaic module 4. In particular, this rigidity is such that, under the plugging-in force of the first and second connectors, the connector of the first type moves by less than 5 mm, preferably less than 2 mm. An electrical wire or electrical cable such as is known from the prior art does not constitute a mechanical link element in the sense of the invention.

The device also comprises an electrical connection element 3 of a second type comprising an electrical connector 34, 35 of the second type, for example a female connector, and a second mechanical link element 33, 36 from the photovoltaic module to the electrical connector of the second type.

Figure 4:
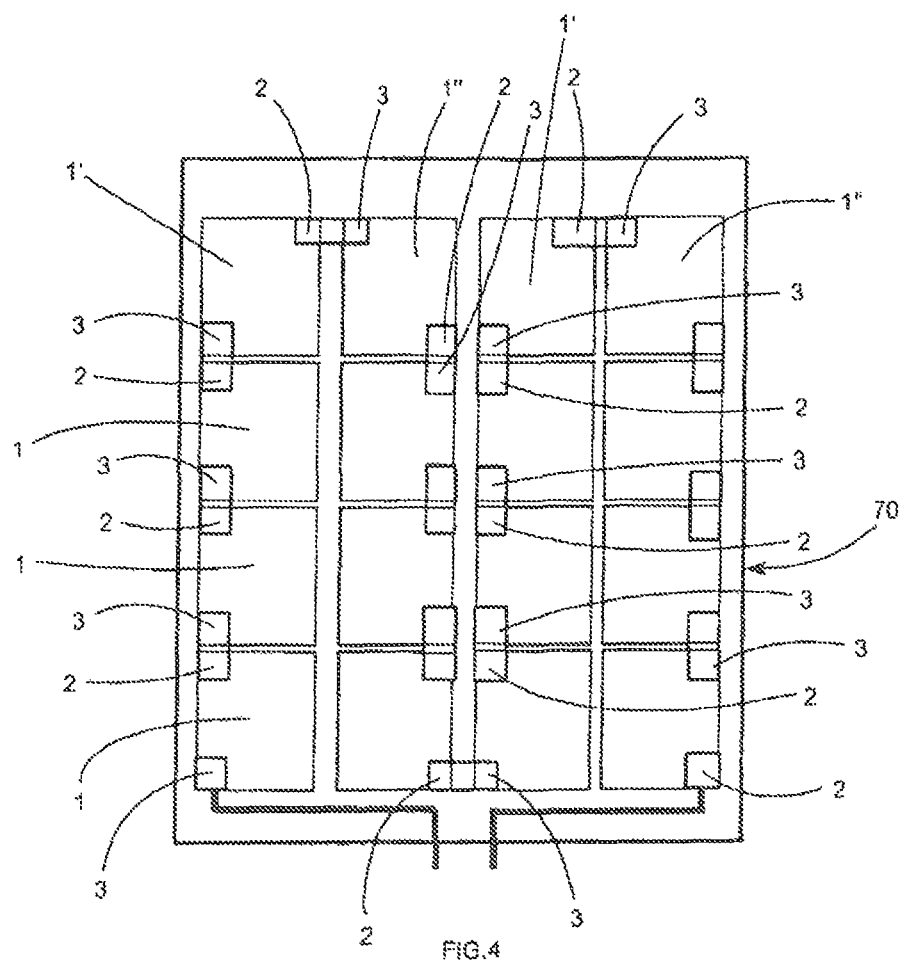
FIG. 4 is a schematic view of an assembly of interconnected photovoltaic modules according to the invention.

As shown in FIG. 4, the electrical connection element of the first type is configured so as to be able to cooperate by plugging in with an electrical connection element of the second type of a first other adjacent photovoltaic module device. Similarly, the electrical connection element 3 of the second type is configured so as to be able to cooperate by plugging in with an electrical connection element of the first type of a second other adjacent photovoltaic module device. For this purpose, the electrical connection elements of the first type and/or of the second type are preferably arranged along an edge 5, 6, 7 of the photovoltaic module. They can be arranged on the same face of a photovoltaic module or on various faces of a photovoltaic module.

According to a first variant of the device 1, the electrical connection element of the first type and the electrical connection element of the second type are aligned along an axis parallel to the length of the photovoltaic module. Such modules allow the assembly of a row of module devices within an assembly 70 of several photovoltaic module devices.

According to a second variant of the device 1' and a third variant of the device 1", the electrical connection element 2 of the first type and the electrical connection element 3 of the second type are disposed on two adjacent sides of the photovoltaic module. Such modules allow the assembly of module devices in such a manner as to form an angle within the set 70 of several photovoltaic module devices.

As shown in FIGS. 5 to 7, a first embodiment of a connection element of the first type and a first embodiment of a connection element of the second type are assembled.

The connection element 2 of the first type comprises an electrical connector of the first type 24, 25, a first mechanical link element 23, 26 from the photovoltaic module 4 to the electrical connector of the first type 24, 25. The mechanical link element comprises a first guiding element 26 and an end stop 23. The connector of the first type comprises a body 24 and a head 25. The guiding element 26 allows the connector of the first type to be guided via the body of the latter. For example, the guiding element consists of a flexible element such as a diaphragm within the opening from which the body 24 of the connector of the first type comes out. The guiding element allows the connector of the first type to be guided in one direction 29 while allowing a certain amount of pivoting around this direction. Furthermore, the movement of the connector of the first type with respect to the photovoltaic module takes place against the action of a resistive force defined by the guiding element. This movement is limited by the end stop 23.

The first mechanical link element from the photovoltaic module to the electrical connector of the first type is advantageously a mechanical link element allowing at least a certain degree of freedom of movement of the electrical connector of the first type with respect to the photovoltaic module. Advantageously, the six degrees of freedom are possible within a certain limit, in other words the amplitude of each degree of freedom is limited. Advantageously again, the amplitudes of the movements in translation possible between the electrical connector of the first type and the photovoltaic module are not necessarily the same in all the directions. In one particular application, the amplitudes of movements over the plane parallel to the surface of the modules in X and Y will be 0.5 mm, whereas on the perpendicular axis Z, only 0.1 mm will be possible. It goes without saying that only certain degrees of freedom in translation (from amongst the translation perpendicular to the plane of the module, the translation parallel to the edge of the module onto which the connection element is mounted and the translation perpendicular to the edge of the module onto which the connection element is mounted) can be allowed. Similarly, the amplitudes of the movements in rotation possible between the electrical connector of the first type and the photovoltaic module are not necessarily the same in all the directions. In one particular application, the amplitudes of rotations may be 1° along the axes X, Y and 0.5° on the axis Z. It goes without saying that only certain degrees of freedom of rotation (from amongst rotation perpendicular to the plane of the module, rotation parallel to the edge of the module onto which the connection element is mounted and rotation perpendicular to the edge of the module onto which the connection element is mounted) can be allowed. Any combination of degrees of freedom is possible.

As previously seen, the first mechanical link element can comprise an element for return into a rest position of the electrical connector of the first type with respect to the photovoltaic module. Thus, the element of rappel allows of rappeler in a rest position relative à each degree of freedom for which il existe a mobilite. The strengths of the return forces may be different for different degrees of freedom. Preferably, the intensity of the return force increases when moving away from the current position of the electrical connector with respect to the rest position.

Such a structure allows two photovoltaic modules to be electrically connected together while at the same time allowing slight movements of these with respect to one another. Thus, the possibility of movement between two photovoltaic modules electrically connected together is conserved.

Furthermore, the connector of the first type is electrically connected, for example via its body, to an electrical connection cable 22 connected at another of its ends to a connection or a terminal 21 provided on the photovoltaic module.

According to a first connection element embodiment, the connection element of the second type 3 has the same structure as the connection element of the first type. The elements of the connector of the second type providing the same function as the elements of the connector of the first type have identical numbers for the units of the numerical references. The only difference in structure between the connection element of the first type and the connection element of the second type relates to the connector which is of the first type for the connection element of the first type and which is of the second type for the connection element of the second type. Any combination of degrees of freedom is therefore also possible.

According to a second connection element embodiment, the structure of the connection element of the second type also differs from the structure of the connection element of the first type in that it comprises a second mechanical link element from the photovoltaic module to the electrical connector of the second type which advantageously does not allow all the same degrees of freedom of movement of the electrical connector of the second type with respect to the photovoltaic module as those allowed by the electrical connector of the first type with respect to the photovoltaic module. For example, the second mechanical link element can provide a rigid fixing of the connector of the second type to the photovoltaic module. Advantageously again, the rigid fixing may be provided for one or more directions only in which the first mechanical link element allows one degree of freedom.

The connector of the first type may also be a female connector and the connector of the second type, a male connector.

One embodiment of a method of assembly of several photovoltaic modules according to the invention is described hereinafter with reference to FIGS. 5 to 7.

In a first step, shown in FIG. 5, two photovoltaic modules are brought together. A connection element of the first type 2 is therefore brought up to a connection element of the second type 3.

In a second step, shown in FIG. 6, the connection elements are in contact and a mechanical action is applied enabling the plugging in of the connection elements. This causes a movement of the connectors with respect to the modules. This action (and its reaction) are represented by the arrows 27 and 37.

In a third step, shown in FIG. 7, the connectors of the first type and of the second type come into contact against the end stops 23 and 33. The action (and the reaction) is maintained until the plugging in of the connectors of the first and of the second type. It is noted that, once this position of contact against the end stops, the connectors are to a certain extent freed from the guiding elements and they can therefore move with respect to the photovoltaic modules with a greater freedom. Thus, relative movements of the photovoltaic modules with respect to one another, which may notably be due to the wind and/or to expansion phenomena, are possible.

Figure 8:
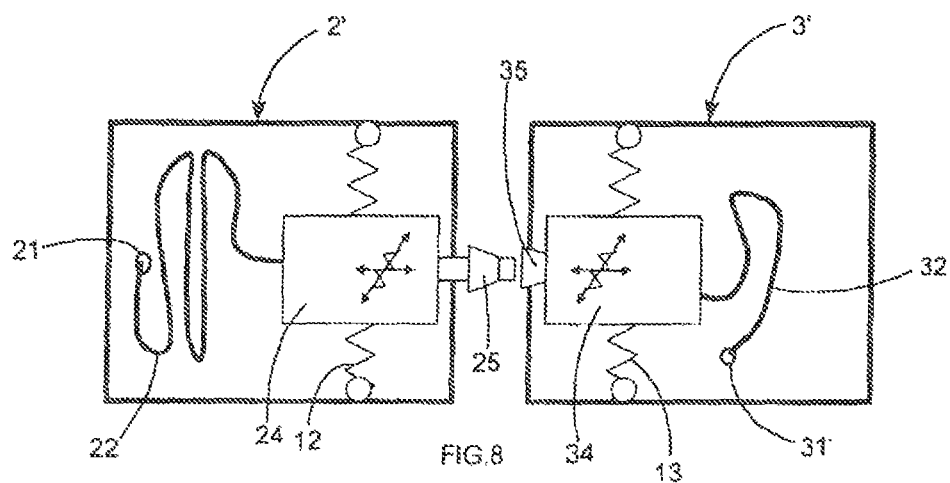
FIG. 8 shows a second embodiment of connection elements.

A second embodiment of a connection element according to the invention and of a photovoltaic module according to the invention are described hereinafter with reference to FIG. 8.

In this second embodiment, the connection elements 2', 3' only differ from the connection elements previously described in that the mechanical link elements comprise one or more springs 12, 13. As previously seen, the mechanical link elements allow the correct plugging in of the connectors to be ensured without the intervention of an operator directly on the latter and, to a certain extent, a possible movement of the connectors relative to the photovoltaic modules to be provided.

Figure 9:
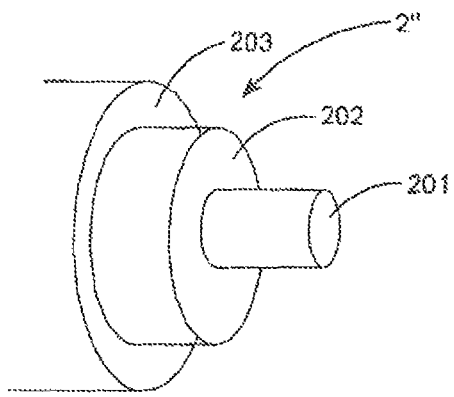
FIG. 9 represents a third embodiment of a connection element.

A third embodiment of a connection element according to the invention and of a photovoltaic module according to the invention is described hereinafter with reference to FIG. 9.

In this third embodiment, the physical structure of the connection element 2" is quite different from the previous ones. The mechanical link element comprises an envelope 203 of given rigidity surrounding a conductor 201 to which the connector of the first type is connected. An electrically-insulating layer 202 is inserted between the conductor 201 and the envelope. This envelope is furthermore fixed to the photovoltaic module. As previously, the mechanical link element, here the envelope, allows the correct plugging in of the connectors to be ensured without the intervention of an operator directly on the latter and, to a certain extent, a possible movement of the connectors relative to the photovoltaic modules to be provided. This is enabled by the determination and construction of an envelope 203 with an appropriate rigidity.

It is noted that, in the various embodiments of the connection element, the latter provides both the electrical connection of the connector to the photovoltaic module and the mechanical link of the connector to the photovoltaic module.

Thanks to the devices according to the invention, the operations for installation and disassembly of photovoltaic modules are simplified and made more reliable.

The photovoltaic module comprises a photovoltaic cell, in particular several photovoltaic cells. It can notably comprise between 60 and 72 photovoltaic cells.

According to a second aspect of the invention, the photovoltaic module device furthermore comprises a mechanical fixing element designed for the mechanical fixing to another adjacent photovoltaic module device. Preferably, the mechanical fixing element is independent of the electrical connection element. "Independent" is understood to mean that the elements are not localized at the same locations on the photovoltaic module device and/or that they do not share a common mechanism and/or that no electrical connection function is provided by the mechanical fixing element and/or that no mechanical fixing function is provided by the electrical connection element.

Figure 10:
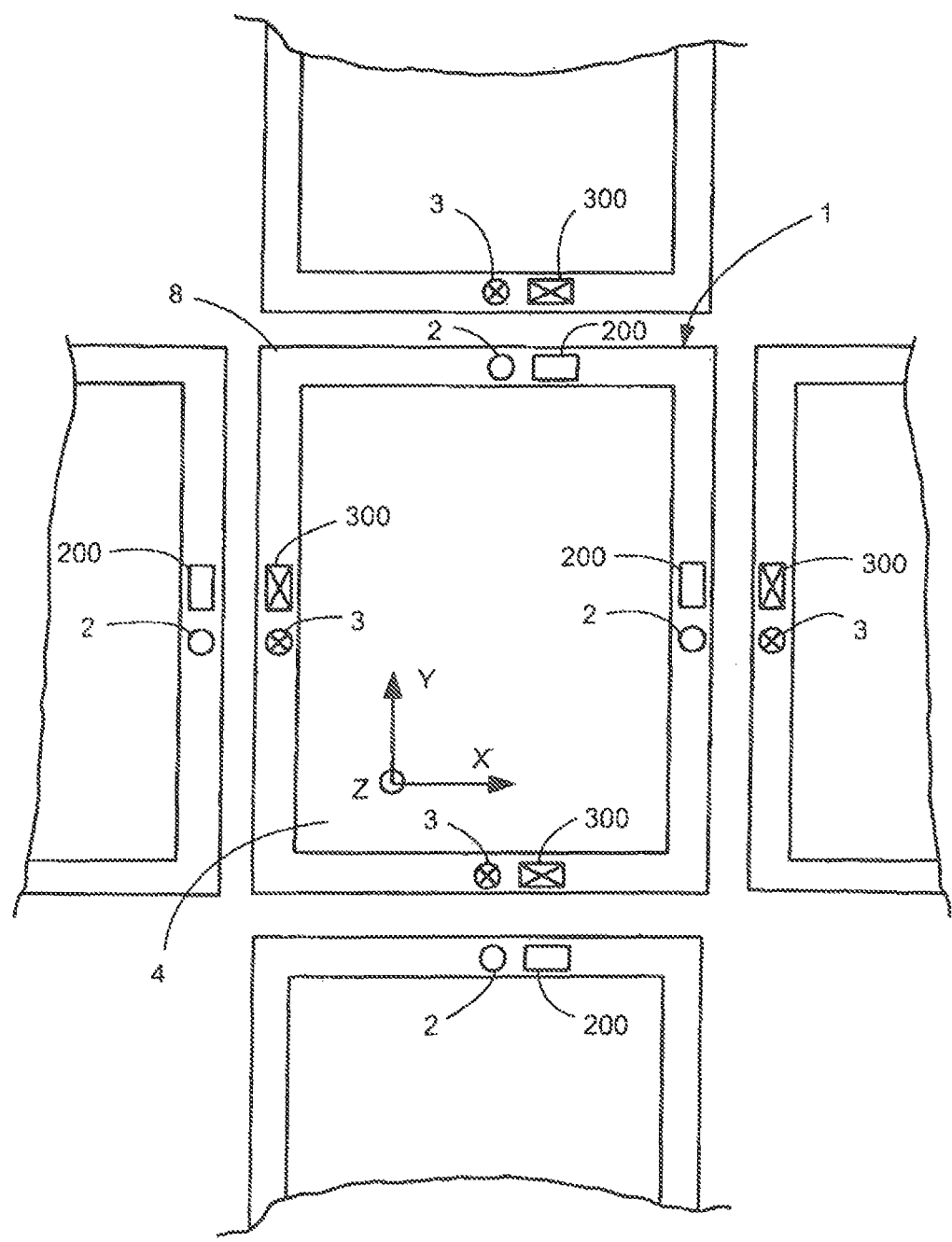
FIG. 10 shows one embodiment of a photovoltaic module device illustrating a second aspect of the invention.

One embodiment of such a photovoltaic module device is shown in FIG. 10. The photovoltaic module device 1 has electrical connection elements 2, 3 designed to allow its electrical connection to the adjacent panels preferably having the same electrical connection elements. The connection elements 2 each cooperate with a connection element 3. The photovoltaic module device 1 has mechanical fixing elements 200, 300 designed to allow its mechanical fixing to the adjacent panels preferably having the same mechanical fixing elements. The fixing elements 200 each cooperate with a fixing element 300. These fixing elements and these connection elements are separate or independent. Preferably, four sides of the photovoltaic module device are equipped with elements for connection to the adjacent devices and with elements for fixing to the adjacent devices (shown partially in a non-assembled configuration in FIG. 10).

It is usual to provide a frame around the photovoltaic modules. In the embodiment of FIG. 10, a frame 8 allows mechanical and electrical issues to be addressed.

The frame 8 incorporates fixing elements 200, 300 allowing the module devices to be mechanically linked together. The installation of the module devices is greatly facilitated by virtue of this configuration. Module assembly matrices may even be produced at the factory so as to be installed with the aid of a mobile crane on the construction site. The frame 8 also incorporates connection elements 2, 3 allowing the module devices to be electrically connected together. The activation or the electrical connection of each module may be carried out after installation on the construction site. This is made possible by the independence existing between the fixing elements for the module devices and the electrical connection elements.

For example, two adjacent devices may be assembled or fixed to one another by their relative displacement along the axis Z or substantially along this axis Z. Any other relative movement may also allow this assembly.

After mechanical fixing of the module devices, the remaining play between these modules must for example be greater than 0.01 mm and less than the maximum movement allowed by the electrical connection elements between the module devices. The mechanical link must withstand the force of the wind. The mechanical attachments and the electrical connections between the module devices must potentially be made on the 4 sides of the devices.

The solution relies on the management of the relative mechanical tolerances between the electrical connector and the mechanical link of the module. According to the second aspect of the invention, in the various embodiments, preferably, in at least certain directions, and advantageously in all the directions, the amplitudes of the various degrees of freedom (rotation, translation) of the electrical connections are greater than the amplitudes of the various degrees of freedom of the mechanical attachments. Here, the amplitudes of the degrees of freedom are compared between two module devices linked via a mechanical fixing and the amplitudes of the degrees of freedom between two module devices if they were linked via an electrical connection only (in the absence of the mechanical fixing). Thus, the play in the mechanical fixing is less than that in the electrical connection in order for there to be no mechanical force on the electrical connection. It is the mechanical fixing elements that have to absorb the transmissions of forces. For example, in order to achieve this, in some directions or in all the directions, the amplitudes of the various degrees of freedom (rotation, translation) of the electrical connection elements are greater than the amplitudes of the various degrees of freedom of the mechanical fixing elements.

For this purpose, the photovoltaic module device incorporates, preferably on each edge of the frame:
- an element for mechanical fixing to an adjacent device, the element allowing for example a mutual alignment of the frames with a maximum play of ±0.03 mm, and
- an element for electrical connection to an adjacent device, the connection element allowing for example a good electrical contact to be established without mechanical stresses, even despite a possible maximum misalignment between two adjacent devices of ±0.5 mm.

Thus, with such characteristics, it is clear that it really is the mechanical fixing elements which provide the mechanical attachment between the devices and not the electrical connection elements.

The mechanical fixing elements absorb all the mechanical forces due to differential expansion phenomena and to the wind. These elements may notably be formed by screw or by ball and spring locking systems. Preferably, the devices are fixed together via removable clip attachments. The dismantling force must be greater than the usual forces to which the devices are subjected during the installation, during expansion phenomena and under the effects of the wind. Nevertheless, the dismantling force must remain reasonable in order to enable an operator to readily perform maintenance operations requiring a disassembly.

One embodiment of electrical connection elements, on the male side, can simply consist of a cylindrical shaft and, on the female side, of cutouts in a conducting sheath. The sheath can comprise a circular cutout with a diameter slightly smaller than that of the shaft and radial sectioning extending from the circular cutout. The shaft can thus penetrate into the cutout and deform the sheath around the latter. This deformation is the consequence of a contact which is established.

Preferably, the mechanical fixing elements are positioned in the corners of the module device, notably in the corners of the frame. The positioning of the devices with respect to one another is thus improved.

By virtue of this second aspect of the invention, the installation can be simplified by transferring the stresses onto the mechanical fixing elements. The installation tolerance is thus improved.

If the mechanical fixing elements are disposed near to the electrical connection elements, the centering on the mechanical fixing elements is promoted and the assembly mechanical tolerance between the devices is thus reduced. This arrangement offers the advantage of reducing the mechanical stresses on the electrical connection elements, thus improving the reliability of the connection, in other words a gain in lifetime is obtained.

The mechanical tolerance of the whole assembly of the devices thus assembled is consequently transferred onto a support of the roofing framework and chassis type.

Ideally, the frame is moulded from a single piece, or even directly overmoulded around the photovoltaic module 4. The materials used for this moulding are preferably made of an electrically-insulating plastic with an excellent resistance over time to UV (ultra-violet radiation), and/to temperature (negative −60° C. for example and positive +125° C. for example). It may be envisaged to form the frame using extruded profiled members of the PVC type, allowing the cost and the complexity of manufacture to be reduced. These techniques are based on the manufacturing methods for PVC windows. Polyurethane, polypropylene, ABS, POM or other plastics complying with the demands on physical resistance and cost may also be used. The use of members made of metal such as steel, aluminum or zinc may also be envisaged. These materials comply with the demands as regards the reaction to fire, the resistance to fire (class M0 or M1, NFP92-50X) and electrical risks.

The invention claimed is:

1. A photovoltaic module device comprising:
a photovoltaic module,
an electrical connection element of a first type, and
an electrical connection element of a second type,
the electrical connection element of the first type comprises:
 a male connector, and
 a first mechanical link element configured to connect the photovoltaic module to the male connector, wherein the first mechanical link element comprises:
  a first diaphragm, and
  a first end stop,
the electrical connection element of the second type comprises:
 a female connector, and
 a second mechanical link element from the photovoltaic module to the female connector, wherein the second mechanical link element comprises:
  a second diaphragm, and
  a second end stop,
wherein the first diaphragm and the second diaphragm extend in a direction perpendicular to the direction in which the male and female connectors engage,
wherein the first mechanical link element enables the male connector to be plugged into a female connector of a first other photovoltaic module device without exerting any mechanical action directly on the male connector, while at the same time enabling freedom of movement of the male connector with respect to the photovoltaic module, and
wherein the second mechanical link element enables the female connector to be plugged into a male connector of a second other photovoltaic module device without exerting any mechanical action directly on the female connector, while at the same time enabling freedom of movement of the female connector with respect to the photovoltaic module, and
wherein the photovoltaic module device comprises a first mechanical fixing element configured to mechanically fix to the first other photovoltaic module device, the first mechanical fixing element being independent of the male connector, and
wherein the photovoltaic module device comprises a second mechanical fixing element configured to mechanically fix to the second other photovoltaic module device, the second mechanical fixing element being independent of the female connector.

2. The device according to claim 1, wherein the electrical connection element of the first type and/or electrical connection element of the second type is arranged on an edge of the photovoltaic module.

3. The device according to claim 1, wherein the electrical connection element of the first type and the electrical connection element of the second type are aligned or substantially aligned along an axis parallel to the length or to the width of the photovoltaic module or are parallel or substantially parallel to the length or to the width of the photovoltaic module or are perpendicular or substantially perpendicular to the photovoltaic module.

4. The device according to claim 1, wherein the electrical connection element of the first type and the electrical connection element of the second type are disposed on two adjacent sides of the photovoltaic module.

5. An assembly of photovoltaic modules according to claim 1, the photovoltaic modules being connected together via electrical connection elements of the first type and electrical connection elements of the second type.

6. The device according to claim 1, wherein the first diaphragm includes a hole for receiving the electrical connection element of the first type and second diaphragm includes a hole for receiving the electrical connection element of the second type.

7. A photovoltaic module device comprising:
a photovoltaic module,
an electrical connection element of a first type, and
an electrical connection element of a second type,
the electrical connection element of the first type comprises:
  a housing that houses:
    a male connector, and
    a first mechanical link element from the photovoltaic module to the male connector, wherein the first mechanical link element comprises:
      at least one spring directly affixed to the housing of the electrical connection element of the first type,
the electrical connection element of the second type comprises:
  a housing, that houses:
    a female connector, and
    a second mechanical link element from the photovoltaic module to the female connector, wherein the second mechanical link element comprises:
      at least one spring directly affixed to the housing of the electrical connection element of the second type,
  wherein the at least one spring of the first mechanical link element and the at least one spring of the second mechanical link element extend in a direction perpendicular to the direction in which the male and female connectors engage,
  wherein the first mechanical link element enables the male connector to be plugged into a female connector of a first other photovoltaic module device without exerting any mechanical action directly on the male connector, while at the same time enabling freedom of movement of the male connector with respect to the photovoltaic module, and
  wherein the second mechanical link element enables the female connector to be plugged into a male connector of a second other photovoltaic module device without exerting any mechanical action directly on the female connector, while at the same time enabling freedom of movement of the female connector with respect to the photovoltaic module, and
  wherein the photovoltaic module device comprises a first mechanical fixing element configured to mechanically fix to the first other photovoltaic module device, the first mechanical fixing element being independent of the male connector, and
  wherein the photovoltaic module device comprises a second mechanical fixing element configured to mechanically fix to the second other photovoltaic module device, the second mechanical fixing element being independent of the female connector.

8. The device according to claim 7, wherein the electrical connection element of the first type and/or electrical connection element of the second type is arranged on an edge of the photovoltaic module.

9. The device according to claim 7, wherein the electrical connection element of the first type and the electrical connection element of the second type are aligned or substantially aligned along an axis parallel to the length or to the width of the photovoltaic module or are parallel or substantially parallel to the length or to the width of the photovoltaic module or are perpendicular or substantially perpendicular to the photovoltaic module.

10. The device according to claim 7, wherein the electrical connection element of the first type and the electrical connection element of the second type are disposed on two adjacent sides of the photovoltaic module.

11. An assembly of photovoltaic modules according to claim 7, the photovoltaic modules being connected together via electrical connection elements of the first type and electrical connection elements of the second type.

* * * * *